(12) United States Patent
Sandvik et al.

(10) Patent No.: US 7,002,156 B2
(45) Date of Patent: Feb. 21, 2006

(54) DETECTION SYSTEM INCLUDING AVALANCHE PHOTODIODE FOR USE IN HARSH ENVIRONMENTS

(75) Inventors: Peter M. Sandvik, Guilderland, NY (US); Dale M. Brown, Schenectady, NY (US); Stephen D. Arthur, Glenville, NY (US); Kevin S. Matocha, Troy, NY (US); James W. Kretchmer, Ballston Spa, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/994,980

(22) Filed: Nov. 19, 2004

(65) Prior Publication Data

US 2005/0098844 A1  May 12, 2005

Related U.S. Application Data

(62) Division of application No. 10/314,986, filed on Dec. 10, 2002, now Pat. No. 6,838,741.

(51) Int. Cl.
*G01J 1/24* (2006.01)

(52) U.S. Cl. ............... 250/370.11; 250/370.01; 250/370.14; 257/438; 257/446; 257/463; 257/464

(58) Field of Classification Search ..... 250/370.01–15, 250/370.1; 257/438, 446, 463–464
See application file for complete search history.

(56) References Cited

U.S. PATENT DOCUMENTS

| | | | |
|---|---|---|---|
| 4,949,144 A | 8/1990 | Kuroda et al. |
| 5,179,430 A | 1/1993 | Torikai |
| 5,257,496 A | 11/1993 | Brown et al. |
| 5,303,684 A | 4/1994 | Brown et al. |
| 5,394,005 A | 2/1995 | Brown et al. |
| 5,467,185 A | 11/1995 | Engerler et al. |
| 5,480,298 A | 1/1996 | Brown |
| 5,544,478 A | 8/1996 | She et al. |
| 5,581,987 A | 12/1996 | Schuyler |
| 6,013,919 A | 1/2000 | Schneider et al. |
| 6,057,917 A | 5/2000 | Petersen et al. |
| 6,147,391 A | 11/2000 | Bowers et al. |
| 6,239,434 B1 | 5/2001 | Brown |

(Continued)

OTHER PUBLICATIONS

Yang, et al., Low Dark Current GaN Avalanche Photodiodes, IEEE Journal of Quantum Electronics, vol. 36, No. 12, 2000, pp. 1389-1391.

(Continued)

*Primary Examiner*—Donghee Kang
(74) *Attorney, Agent, or Firm*—Ann M. Agosti; Patrick K. Patnode (57) ABSTRACT

A detection system for detecting gamma rays including a scintillator crystal for receiving at least one gamma ray and generating at least one ultraviolet ray and an avalanche photodiode for detecting the ultraviolet ray. The avalanche photodiode includes: a substrate having a first dopant; a first layer having a second dopant, positioned on top of the substrate; a passivation layer for providing electrical passivation on a surface of the avalanche photodiode; a phosphorous silicate glass layer for limiting mobile ion transport, positioned above of the first layer; and a pair of metal electrodes for providing an ohmic contact wherein a first electrode is positioned below the substrate and a second electrode is positioned above the first layer. The avalanche photodiode comprises a first sidewall and a second sidewall forming a sloped mesa shape.

27 Claims, 9 Drawing Sheets

U.S. PATENT DOCUMENTS

| | | |
|---|---|---|
| 6,265,727 B1 | 7/2001 | Kozodoy et al. |
| 6,326,654 B1 | 12/2001 | Ruden et al. |
| 6,350,988 B1 | 2/2002 | Brown |
| 6,768,326 B1 | 7/2004 | Brown et al. |
| 2001/0009268 A1 | 7/2001 | Brown et al. |

OTHER PUBLICATIONS

Hong, et al., "Optical and Noise Characteristics of Amorphous Si/SiC Super Lattice Reach-Through Avalanche Photodiodes, IEEE Trans on Electron Devices", vol. 37, No. 8, 1990, pp. 1804-1808.

Yan et al., "Demonstration of 4H SiC Avalanche Photodiode Linear Array", Material Science Forum, vols. 389-393, 2002, pp. 1431-1434.

Yan et al., Demonstration of the First 4H-SiC Avalanche Photodiodes, Solid State Electronics, vol. 44, 2000, pp. 341-346.

Brown, et al., "Silicon Carbide UV Photodiodes", IEEE Trans on Electron Devices, vol. 40, No. 2, 1993, p. 325-333.

Konstantinov, et al., "Temperature Dependence of a Avalanche Breakdown for Epitaxial Diodes in 4H Silicon Carbide", App. Physics Letters, vol. 73, No. 13, 1998, pp. 1850-1852.

Konstantinov, et al., Ionization Rates and Critical Fields in 4H Silicon Carbide, App. Physics Letters, vol. 71, No. 1, 1997, pp. 90-92.

Konstantinov, et al., "Ionization Rates and Critical Fields in 4H SiC Junction Devices", Materials Science Forum, vol. 264-268, 1998, pp. 513-516.

Ng, et al., Multiplication and Excess Noise Characteristics of Thin 4H-SiC, UV Avalanche Photodiodes, IEEE Photonics Technology Letters, vol. 14, No. 9, 2002, p. 1342-1344.

Yan, et al., Low Noise Visible-Blind UV Avalanche Photodiodes With Edge Terminated by 2° Positive Bevel, Electronics Letter, vol. 38, No. 7, 2002, pp. 335-336.

Yan, et al., "4H-SiC Avalanche Photodiode With Multistep Junction Extension Termination", Electronic Letter, vol. 37, No. 17, 2001, pp. 1080-1081.

Yan, et al., "Design and Fabrication FO 4H-SiC APD Linear Arrays", Semiconductor Research Symposium, 2001 Intl., 2001, pp. 17-20.

Negoro, et al., "Avalanche Phenomena in 4H-SiC p-n Diodes Fabricated by Aluminum or Boron Implantation", IEEE Trans. on Electron Devices, vol. 49, No. 6, 2002, pp. 1505-1509.

Verghese, et al., "GaN Avalanche Photodiodes Operating in Linear-Gain Mode and Geiger Mode", IEEE Trans. on Electron Devices, vol. 48, No. 3, 2001, pp. 502-511.

McIntosh, et al., Ultraviolet Photon Counting with GaN Avalanche Photodiodes, App. Physics Letter, vol. 76, No. 26, 2000, pp. 3938-3940.

Carrano, et al., "GaN Avalanche Photodiodes", App. Physics Letter, vol. 76, No. 7, 2000, pp. 924-926.

McIntosh, et al., GaN Avalanche Photodiodes Grown by Hydride Vapor-Phase Expitaxy, App. Physics Letter, vol. 75, No. 22, 1999, pp. 3485-3487.

Reigrotzki, et al., "Hole Initiated Impact Ionization in Wide Band Gap Semiconductors", Journal. of App. Physics, vol. 86, No. 6, 1999, pp. 4458-4463.

Brown, SiC Flame Sensors for Gas Turbine Control Systems, Solid State Electronics, vol. 42, No. 5, 1998, pp. 755-760.

Konstantinov, et al., "Study of Avalanche Breakdown and Imapct Ionization in 4HSilicon Carbide", Journal of Electronic Materials, vol. 27, No. 4, 1998, pp. 335-341.

Vasile, et al., "Photon Detection with High Gain Avalanche Photodiodes Arrays", IEEE Trans. on Nuclear Science, vol. 45, No. 3 1998, pp. 720-723.

Vasile, et al., "High Gain Avalanche Photodiodes Arrays for Dirc Applications", IEEE Trans on Nuclear Science, vol. 46, No. 4, 1999, pp. 848-852.

Brown, et al., "Silicon Carbide UV Photodiodes", IEEE Transaction on Electron Devices, vol. 40, No. 2, 1992, pp. 325-333.

Glasgow, et al., "SiC-UV-PhotoDetectors", Optoelectronic Technologies for Remote Sensing from Space, SPIE. VOL. 868, 1997, pp. 40-45.

Carano, et al., "Very Low Dark Current Metal-Semiconductor-Metal Ultraviolet Photodetectors Fabricated on Single-Crystal GaN Epitaxial Layers", Appl. Physics Letter, 70, No. 15, 1997, pp. 1992-1994.

F. Yan, et al., "Low-Noise Visible-Blind UV Avalanche Photodiodes with Edge Terminated by 20 Positive Bevel", Electronics Letters, vol. 38, No. 7, Mar. 2002, pp. 335.

DETECTION SYSTEM INCLUDING AVALANCHE PHOTODIODE FOR USE IN HARSH ENVIRONMENTS

This is a division of Ser. No. 10/314,986 filed on Dec. 10, 2002 now U.S. Pat. No. 6,838,741.

BACKGROUND OF THE INVENTION

This invention relates generally to avalanche photodiodes and, more particularly, to an avalanche photodiode (APD) for use in harsh environments, such as oil well drilling applications, wherein the avalanche photodiode comprises silicon carbide (SiC) materials or gallium nitride (GaN) materials.

There is currently a need for gamma ray detection in the oil well drilling industry. High energy gamma rays reflected from Hydrogen (H) bearing compounds underground may indicate specific locations which may have oil. A small, robust sensor capable of detecting such rays is highly desirable and necessary for harsh, down-hole environments where shock levels are near 250 gravitational acceleration (G) and temperatures approach or exceed 150° Celsius (C).

Several current technologies utilize photomultiplier tubes (PMTs) to transform low-level ultraviolet (UV) light signals to readable level electronic signals. However, PMTs have a negative temperature coefficient. Thus, PMTs become less sensitive as temperature increases. PMTs are also fragile and prone to fail when vibration levels are high. For certain applications (e.g., at 150° C. where PMTs have ~50% signal), the lifetimes of PMTs may become prohibitively short, thereby driving the cost of their use up sharply. Another problem faced by PMTs involves high noise levels, which make accurate signal detection increasingly difficult.

APDs are high-speed, high sensitivity photodiodes utilizing an internal gain mechanism that functions by applying a reverse voltage. Compared to PIN photodiodes, APDs can measure even lower level light and are used in a wide variety of applications requiring high sensitivity. Silicon may be used in APDs due to its very high ionization coefficient ratio, which results in a high-gain bandwidth product and very low excess noise. However, silicon has a very low absorption coefficient especially at a fiber-optic and free-space optical communications wavelengths at 1.3 microns and 1.5 microns. An advantage of using silicon for a multiplication region within an ADP is due to a high ionization coefficient ratio, which results in much higher sensitivity, higher-gain bandwidth product, lower noise and higher temperature and voltage stability.

Other conventional APDs may include near-infrared indium gallium arsenide/indium phosphide (InGaAs/InP) APDs that are limited in performance by a small ionization coefficient ratio, which results in low-gain bandwidth product and high excess noise. At shorter wavelengths, silicon (Si) APDs are used extensively for applications where high sensitivity and high-gain bandwidth product are required.

Conversely, silicon is likely not to perform well at high temperatures and high vibration environments. Silicon has inherent disadvantages which preclude its ease of use and implementation in many applications. More specifically, Si-based devices suffer largely from degradation when exposed to harsh environments or temperatures above 150 degrees Celsius. Complex, expensive cooling systems and packages are required to facilitate successful operation of Si-based APDs, limiting their wide spread use in harsh environment applications.

These and other drawbacks exist in current systems and techniques.

BRIEF DESCRIPTION OF THE INVENTION

In accordance with an exemplary aspect of the present invention, an avalanche photodiode for detecting ultraviolet photons comprises a substrate having a first dopant; a first layer having the first dopant, positioned on top of the substrate; a second layer having a second dopant, positioned on top of the first layer; a third layer having a second dopant, positioned on top of the second layer; a passivation layer for providing electrical passivation on a surface of the avalanche photodiode; a phosphorous silicate glass layer for limiting mobile ion transport, positioned on top of the third layer; and a pair of metal electrodes for providing an ohmic contact wherein a first electrode is positioned below the substrate and a second electrode is positioned above the third layer; wherein the avalanche photodiode comprises a first sidewall and a second sidewall forming a sloped mesa shape; and wherein the avalanche photodiode operates in an environment comprising a temperature approximately equal to 150 degrees Celsius.

In accordance with another exemplary aspect of the present invention, a detection system for detecting gamma rays comprises a scintillator crystal for receiving at least one gamma ray and generating at least one ultraviolet ray; an avalanche photodiode for detecting the ultraviolet ray wherein the avalanche photodiode comprises: a substrate having a first dopant; a first layer having the first dopant, positioned on top of the substrate; a second layer having a second dopant, positioned on top of the first layer; a third layer having a second dopant, positioned on top of the second layer; a passivation layer for providing electrical passivation on a surface of the avalanche photodiode; a phosphorous silicate glass layer for limiting mobile ion transport, positioned on top of the third layer; and a pair of metal electrodes for providing an ohmic contact wherein a first electrode is positioned below the substrate and a second electrode is positioned above the third layer; wherein the avalanche photodiode comprises a first sidewall and a second sidewall forming a sloped mesa shape; and wherein the avalanche photodiode operates in an environment comprising a temperature approximately equal to 150 degrees Celsius; and a lens structure for focusing the ultraviolet ray from the scintillator crystal to the avalanche photodiode.

In accordance with another exemplary aspect of the present invention, an array structure comprising a plurality of avalanche photodiodes, wherein each avalanche photodiode comprises a substrate having a first dopant; a first layer having the first dopant, positioned on top of the substrate; a second layer having a second dopant, positioned on top of the first layer; a third layer having a second dopant, positioned on top of the second layer; a passivation layer for providing electrical passivation on a surface of the avalanche photodiode; a phosphorous silicate glass layer for limiting mobile ion transport, positioned on top of the third layer; and a pair of metal electrodes for providing an ohmic contact wherein a first electrode is positioned below the substrate and a second electrode is positioned above the third layer; wherein the avalanche photodiode comprises a first sidewall and a second sidewall forming a sloped mesa shape; and wherein the avalanche photodiode operates in an environment comprising a temperature approximately equal to 150 degrees Celsius.

Aspects of the present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF EXEMPLARY EMBODIMENTS

An aspect of the present invention is directed to an avalanche photodiode (APD) device for use in oil well drilling applications in harsh, down-hole environments where shock levels are near 250 gravitational acceleration (G) and/or temperatures approach or exceed 150° C. Another aspect of the present invention is directed to an APD device fabricated using SiC materials. Another aspect of the present invention is directed to an APD device fabricated using GaN materials. An avalanche photodiode is a photodiode that operates with a reverse bias voltage that causes a primary photocurrent to undergo amplification by cumulative multiplication of charge carriers. As the reverse-bias voltage increases toward a breakdown, hole-electron pairs are created by absorbed photons. An avalanche effect occurs when the hole-electron pairs acquire sufficient energy to create additional pairs of holes and electrons, thereby achieving a signal gain.

Epitaxial layers of specific qualities (e.g., doping and thickness) determine operating characteristics (e.g., an avalanche voltage) of devices (e.g., photodiodes) as well as the gain, which is vital to successful operation. Ionization coefficients in 4H, which is a specific crystalline phase of SiC, have a positive temperature coefficient, which is particularly attractive for a SiC photodiode due to the requirement of ionization in an avalanche process. 4H SiC is a material with a wide band gap (~3.2 eV) and a robust chemical nature. This material can absorb UV light rays. Due at least in part to the wide band gap, the device of an embodiment of the present invention may operate at high temperatures. The device further uses a p-n junction, via the n-type epitaxial layers and the p-type substrate. This may be a location for avalanche once a high reverse bias has been applied to the device.

According to another embodiment of the present invention, a GaN based APD may be implemented for oil well drilling applications. GaN is a material with a wide band gap (3.4 eV) and a robust chemical nature. This material can absorb UV light rays. The GaN APD of the present invention implements a substrate comprising sapphire or bulk GaN with various epitaxial layers grown on top of the substrate. The GaN APD makes use of a p-n junction at high applied voltages to initialize an electrical avalanche or breakdown, near an intended operation point of the device. The electrical field required in this type of device is on the order of a few MeV/cm and is made possible via a depletion region internal to the device and a large external bias.

According to an embodiment of the present invention, the device may include a silicon dioxide ($SiO_2$) passivation layer for providing surface passivation. This $SiO_2$ layer may also serve as an anti-reflection coating, thereby increasing light collection efficiency and overall detection efficiency of the APD device. In addition, a phosphorous silicate glass (PSG) layer may be deposited on the device to control electrical properties otherwise affected by mobile ions. For example, a PSG layer may be provided to prevent mobile ions from moving throughout the device and lowering device performance. Protective layers of $SiO_2$ and PSG provide surface passivation and mobile ion trapping, allowing faster and more efficient device operation while extending the lifetime of the device. In addition, methods for metallization may be used to provide low resistance contacts.

A goal of an APD of an embodiment of the present invention involves detecting low levels of ultraviolet (UV) photons from scintillators (or other devices) excited by gamma rays and transforming a signal to an electrical signal. The APD of an embodiment of the present invention may be used specifically in harsh (e.g., high vibration, high temperature, etc.) environments, requiring robust materials. An aspect of the present invention is directed to an n-p type APD rather than a p-n type device, which is more difficult to realize given its high sensitivity to material defects. The APD device of the present invention may operate within a breakdown region of the SiC semiconductor material (e.g., 1–3 MeV/cm).

Figure 1:
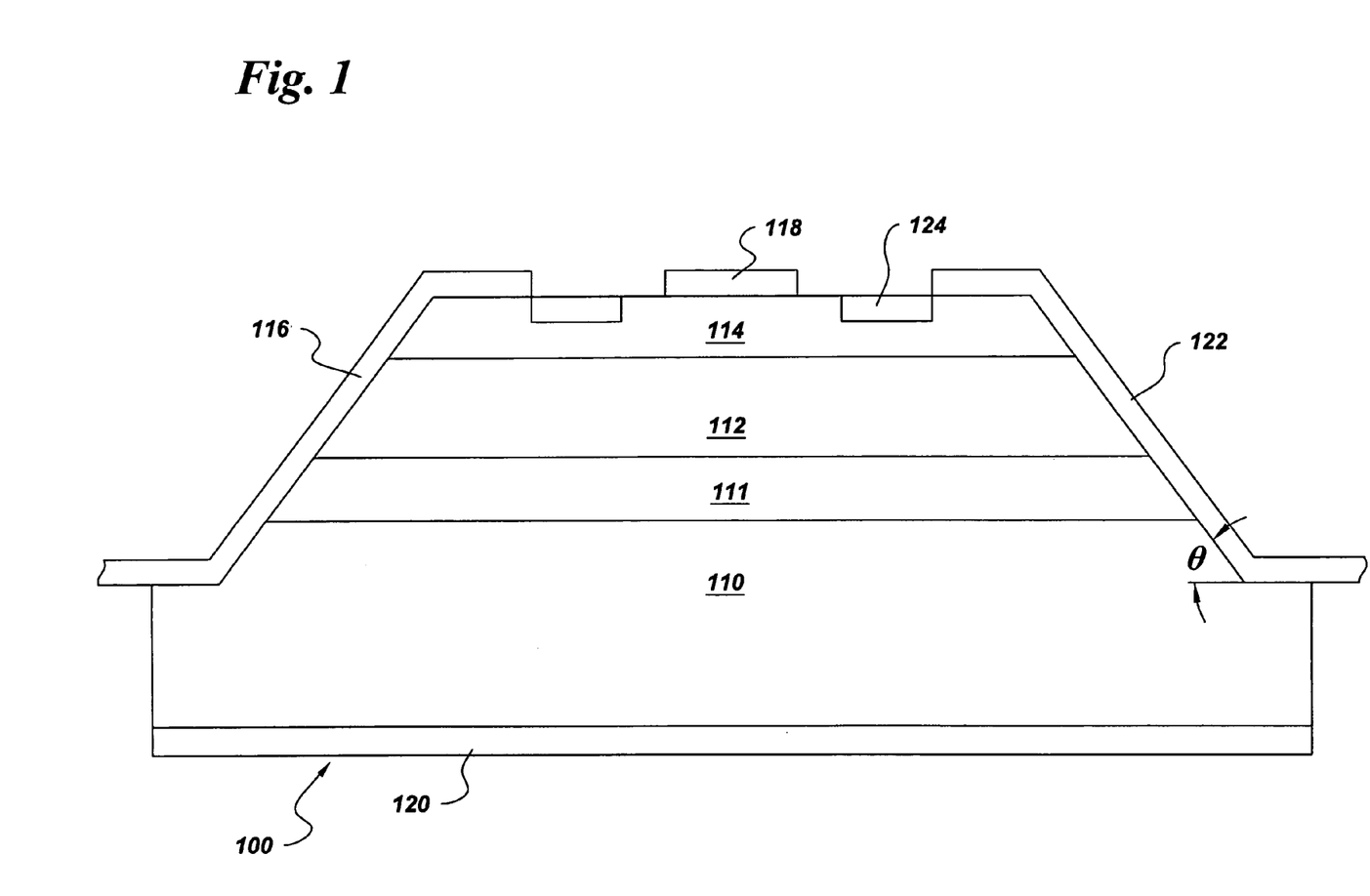
FIG. 1 is an example of a cross sectional view of an avalanche photodiode in accordance with an embodiment of the present invention.

FIG. 1 is an example of a cross sectional view of an avalanche photodiode device in accordance with an embodiment of the present invention. FIG. 1 shows a cross-section of the APD device with a substrate 110, a first epitaxial layer 111, a second epitaxial layer 112 and a third epitaxial layer 114. The heavily doped substrate 110 serves to provide electrical contact through an anode of the device. The plurality of epitaxial layer may be grown on the substrate for the formation of a desired electric field profile as a function of depth in the material. The first epitaxial layer 111 may serve to terminate defects at a substrate/epitaxial layers interface as well as form a p-n junction. The second epitaxial layer 112 may serve to allow for a relatively large penetration depth of UV photons, thereby increasing a probability for absorption and carrier generation events. The third epitaxial layer 114 may provide a low resistance contact to a cathode. This configuration may also serve to confine a high electrical field away from a surface of the device and near the p-n junction and further control a field profile in a manner illustrated in FIGS. 3 and 4 discussed below.

According to an embodiment of the present invention, the substrate 110 may include a p-doped 4H SiC substrate, the first epitaxial layer 111 may include a p-doped 4H SiC layer, the second epitaxial layer 112 may include an n-doped 4H SiC layer and the third epitaxial layer 114 may include an n-doped SiC layer. More specifically, dopant concentration for substrate 110 may be approximately $5e18$ cm$^{-3}$; dopant concentration for the first epitaxial layer 111 may be approximately $1e17$ cm$^{-3}$, dopant concentration for second epitaxial layer 112 may be approximately $5e16$ cm$^{-3}$ to $6e16$ cm$^{-3}$; and dopant concentration for second epitaxial layer 114 may be approximately $5e18$ cm$^{-3}$. First epitaxial layer 111 may have a thickness of approximately 1.5 microns, the second epitaxial layer 112 may have a thickness of approximately 3 microns and third epitaxial layer 114 may have a thickness of approximately 0.4 microns. Other measurements may be implemented as well. For example, the first epitaxial layer 111 may have a thickness of 0.2 to 5 microns with a preferred range of 1 to 2 microns. The second epitaxial layer 112 may have a thickness to facilitate absorption and may range from 2 to 10 microns with a preferred range of 3 to 5 microns. The third epitaxial layer 114 may have a thickness of 0.1 to 2 microns with a preferred range of 0.3 to 0.8 microns.

Metal electrodes 118 and 120 may comprise a combination of various metals. In particular, metal electrode 118 may include Ni/Ti/Mo/Au at a cathode end. Metal electrode 120 may include Al/Ti/Pt/Au at an anode end. Thin metal layers may be used to form electrodes to both p and n contacts while maintaining a low resistance and minimizing or eliminating a drop in electric field. Other materials providing an ohmic contact may be used. Passivation layers 116 and 122 may comprise SiO$_2$, which may have a thickness of 100 Angstroms to several microns (e.g., approximately 5 microns) with a preferred thickness between 1000 Angstroms to 2 microns. In addition, a PSG layer 124 may be implemented to prevent mobile ions from damaging material near the surface and to reduce UV surface reflection. The PSG layer may have a thickness of approximately 300 Angstroms to 1 micron. Other materials and thickness ranges may be implemented.

According to an embodiment of the present invention, the substrate 110 may include a sapphire, bulk GaN, bulk AlN or bulk AlGaN substrate. The first epitaxial layer 111, the second epitaxial layer 112 and the third epitaxial layer 114 may include GaN, AlN, AlGaN or AlInGaN to form a p-n junction where the avalanching will occur. The APD device may also include AlGaN epitaxial layers of various Al and Ga concentrations in order to control wavelength (or energies) of light. It may also include the use of AlInGaN layers of varying Al, In and Ga concentrations. First epitaxial layer 111 may have a thickness of approximately 2 microns, second epitaxial layer 112 may have a thickness of approximately 3 microns and third epitaxial layer 114 may have a thickness of approximately 0.4 microns. Other measurements may be implemented as well, as discussed above in connection with FIG. 1. In a GaN APD, metal electrodes 118 and 120 may comprise a combination of various metals. In particular, metal electrode 118 may include Ti/Au, Ti/Al/Ti/Au or Ti/Al/Pt/Au at a cathode end. Metal electrode 120 may include Ni/Au or Ni/Pt/Au at an anode end. Thin metal layers may be used to form electrodes to both p and n contacts while maintaining a low resistance and minimizing or eliminating drop in electric field. Other materials providing an ohmic contact may be used. Passivation layers 116 and 122 may comprise SiO$_2$. In addition, an optional PSG layer 124 may be implemented to prevent mobile ions from damaging material near the surface and to reduce UV surface reflection. The PSG layer may have a thickness of approximately 500 Angstroms to 1 micron. Other materials and thickness ranges may be implemented.

Figure 2:
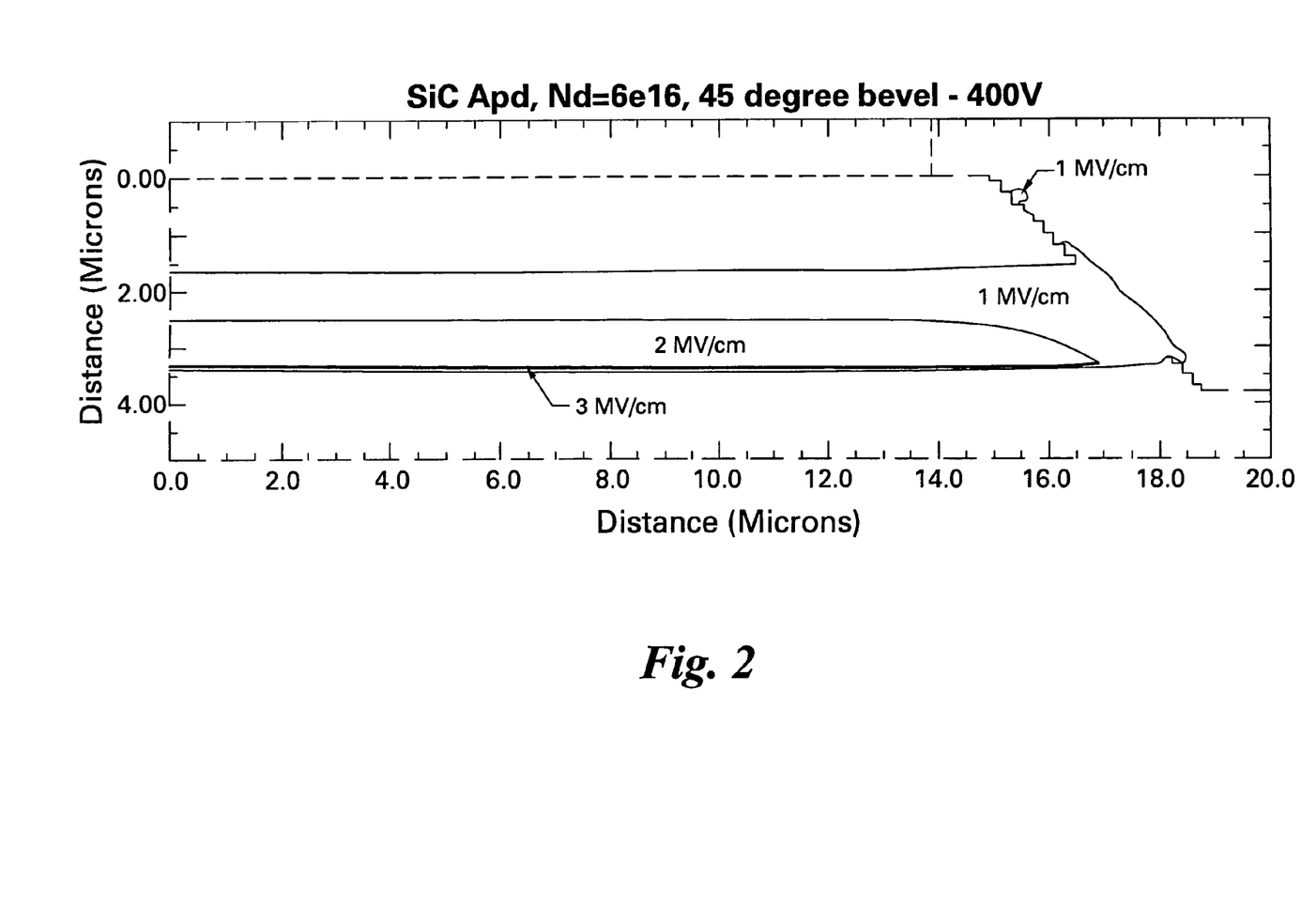
FIG. 2 is an example of a modeled electrical field profile in an APD with a sloped sidewall formation in accordance with an embodiment of the present invention.

FIG. 2 is an example of a modeled electrical field profile in an APD with a sloped sidewall formation of an APD device in accordance with an embodiment of the present invention. FIG. 1 shows electrical fields as a function of position, highlighting a reduction of high fields at the sloped edges where charge is minimized. A lesser field strength at the edge is illustrated by 214. Electrical field 210 in relation to a moderate electric field 212 illustrates a high field contour concentrated away from the edge. At approximately 2 MV/cm, electrical field 210 is adequately high to allow avalanching while maintaining a satisfactory distance away from the surfaces of the SiC (e.g., >1 micron), where the semiconductor may otherwise be subject to high surface leakage. Therefore, the SiO$_2$ layer is important for passivating unsatisfied electric bonds at a surface near sloped sidewalls of a mesa structure. Further, the sloped mesa sidewalls of the APD device minimizes the amount of electrical charge present near the edges of the mesa, thereby lowering the electrical field in that immediate area.

The SiC and GaN materials may be processed using a dry ion based etching technique, resulting in a sloped mesa sidewall. For example, a photoresist, ion etch process and/or a Fluorine-based chemistry may be used to form sloped sidewall mesas of the APD device. The sloped mesa shape allows a high electrical field of the APD device to be confined to a center of the device, thereby making an avalanche mechanism scalable with area. In other words, the use of a sloped mesa sidewall for electrical field confinement enables the device to be scaled to different sizes for more or less active area. This is particularly advantageous for concentrating the highest electrical field to be within the device, and not at the edges of the device.

A specific SiC substrate and epitaxial structure may provide breakdown at approximately 400 to 500 V. In particular, the exemplary structure and doping shown in FIG. 1 may yield an electrical field profile throughout the semiconductor as shown by 320 in FIG. 3, which illustrates an embodiment having a breakdown at approximately 400V. For example, the peak electrical field that may be utilized for breakdown (as well as avalanching) may occur near approximately 1.0E6 V/cm. Here, as the depletion region (e.g., an area where the high field exists) extends for approximately 5 microns, a bias for reaching that peak electric field may be approximately 400 V.

Figure 3:
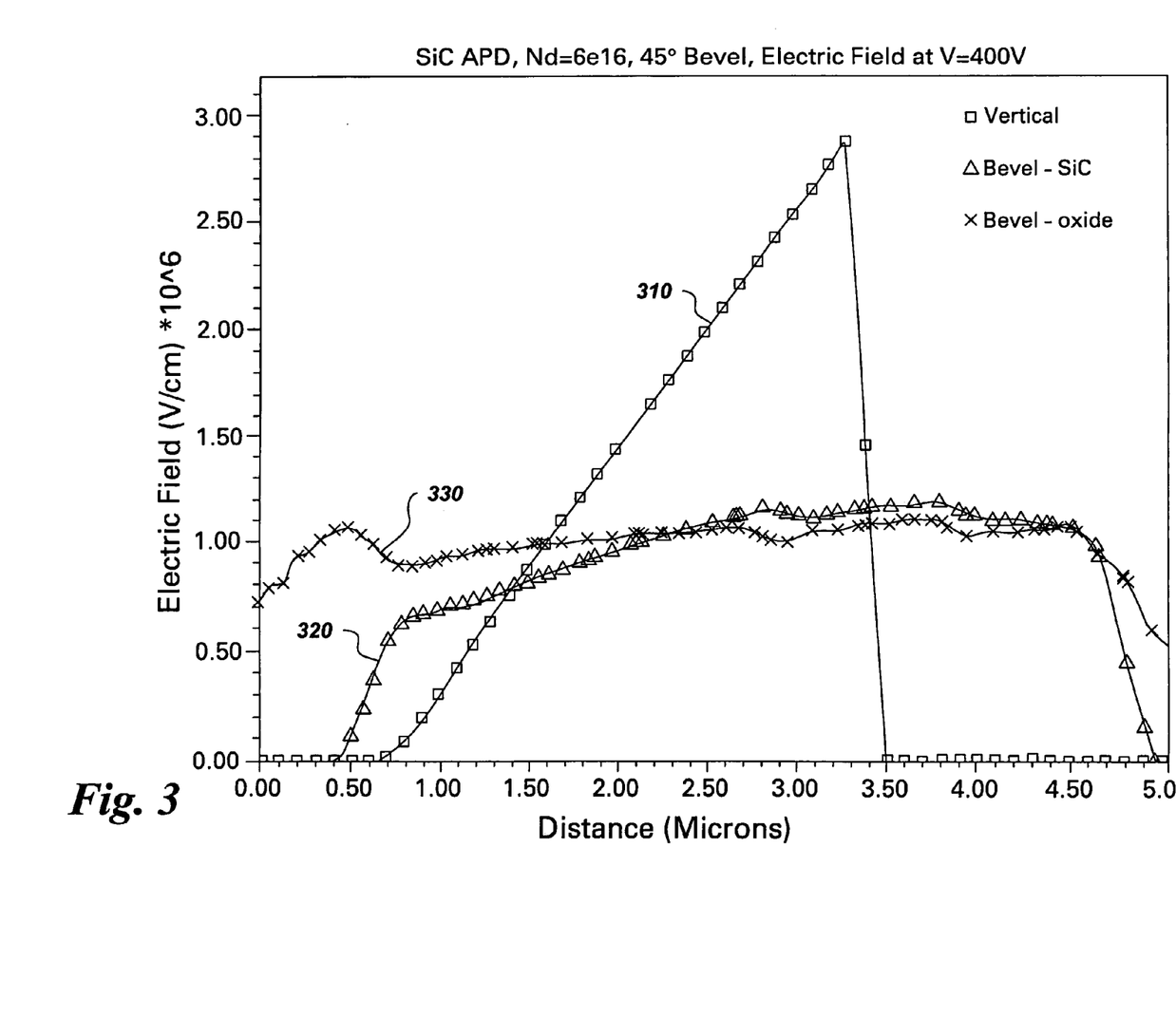
FIG. 3 is an example of a cross section of a modeled electrical field profile in an avalanche photodiode device in accordance with an embodiment of the present invention.

FIG. 3 is an example of a cross section of the modeled electrical field profile in an avalanche photodiode device in accordance with an embodiment of the present invention. Electric field strength plots for cutlines vertically through a center of a model are shown by 310, along a beveled edge inside the device are shown by 320 and along a beveled edge in an oxide region covering the edge are shown by 330. The highest electric field is along the vertical cutline 310 which peaks at about 3.0E6 V/cm. Both the SiC field 320 and the oxide region field 330 covering the bevel peak at approximately 1.0E6 V/cm. Keeping the peak field in the oxide region less than approximately 2 to 3E6 V/cm may be considered useful for oxide reliability concerns. The field plots have a longer extent along these cuts as the path length along the bevel is longer than a vertical cutline.

Figure 4:
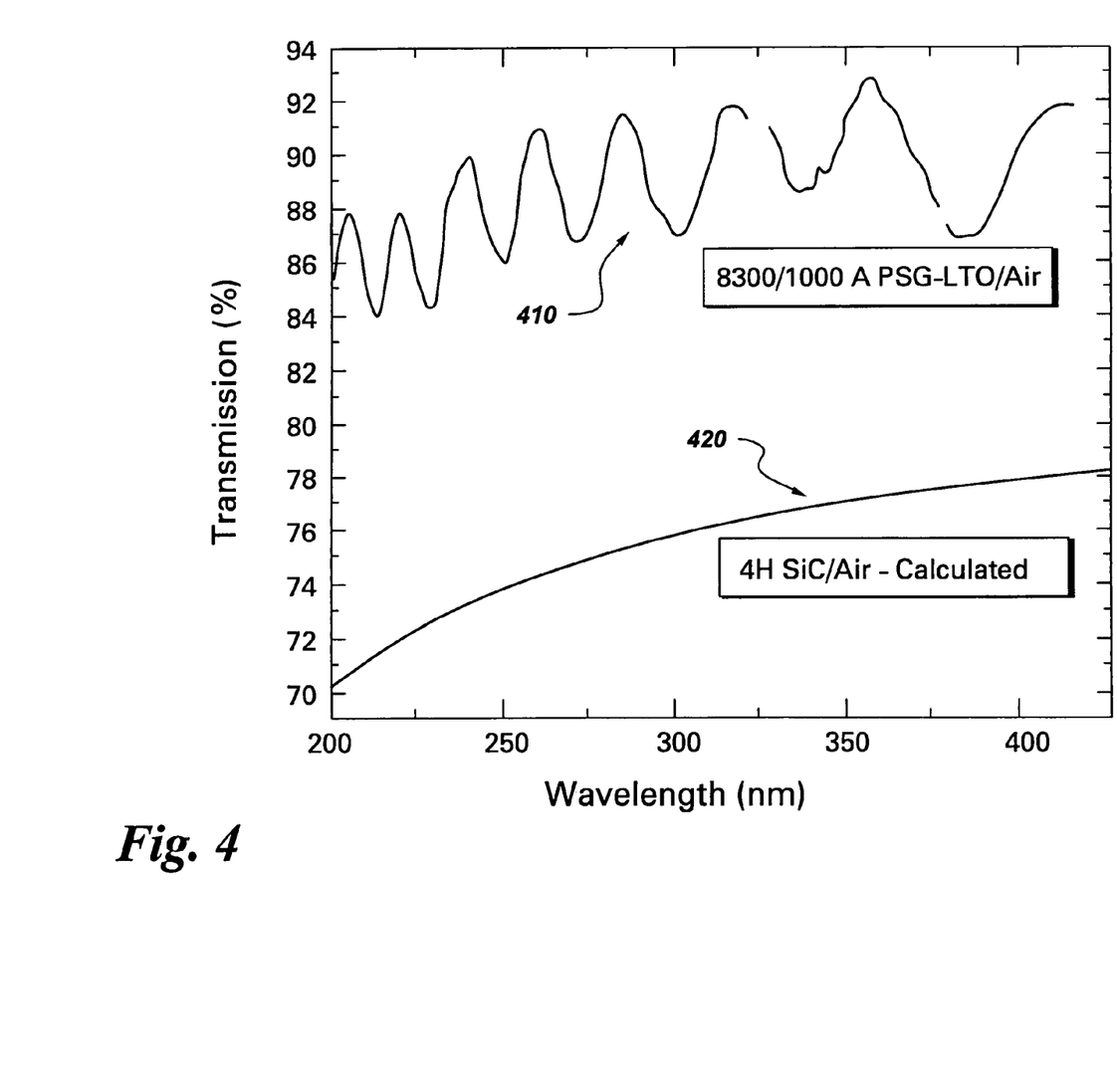
FIG. 4 is an example of optical data from measured transmission of a PSG film and calculated transmission 4H SiC in accordance with an embodiment of the present invention.

FIG. 4 is an example of optical data from measured transmission of a PSG film and calculated transmission 4H SiC in accordance with an embodiment of the present invention. 410 illustrates a measured transmission of PSG in air. As shown in FIG. 4, the measured transmission of PSG in air is higher than a calculated value that would be expected from SiC, as shown by 420. 420 may be determined from an index of refraction for 4H SiC. FIG. 4 shows that a PSG coated surface provides a higher level of light absorption in addition to blocking mobile ions.

The APD device of an embodiment of the present invention avalanches uniformly over a collecting area of the device, rather than at the device edges. A positive beveled junction of the present invention stretches the electric field out at the bevel edges but not along a uniform planar portion of a p-n junction. As a result, the highest electric field and therefore the avalanche operation occurs in an active area of the device and not along its periphery. As a result, power dissipated during the avalanche operation is spread across a widest possible area thereby avoiding hot spot formation and associated reliability problems. The third epitaxial layer 114 may serve to prevent higher electric fields from reaching a surface through internal manipulation of a depletion region. This device implements a p-n junction at high applied voltages to initialize an electrical avalanche (e.g., breakdown), near an intended operation point of the device. The electrical field in this type of device may be in the order of a few MeV/cm, supported by a depletion region internal to the device and produced by a large external bias. This device takes advantage of the robust chemical nature of SiC and GaN materials and its epitaxial layers, to operate at high temperatures (e.g., 150° C. to 200° C.) and/or high vibrations (e.g., 250 G).

According to another embodiment of the present invention, in a separate absorption and multiplication region (SAMR) device, an additional layer may be incorporated between first epitaxial layer 111 and second epitaxial layer 112 wherein the additional layer may have a thickness of approximately 1.0 microns and an N-dopant concentration of approximately 1e17 $cm^{-3}$. This embodiment of the present invention may serve to keep a multiplication region centered around the p-n junction (e.g., where the electric field is highest) apart from an absorption region (e.g., second epitaxial layer 112). This may help to reduce noise observed in the device by minimizing a random absorption phenomena in the multiplication region.

The avalanche aspect of an embodiment of the present invention poses an additional constraint, specifically on the angle of the mesa sidewall. As large electrical fields are required in SiC and GaN breakdown and therefore avalanche (e.g., typically in the order to 1–3 MV/cm), it is desirable to confine the electrical field away from the edges of the APD device to minimize current leakage occurring at a surface. A sloped mesa may include sidewalls intersecting a substrate by an angle between approximately 20 to 45 degrees. There are currently wet and dry etch techniques for SiC, however, dry etch techniques are more repeatable and controllable in comparison to wet techniques in general. According to an embodiment of the present invention, a dry etch technique may be implemented.

In dry etching techniques, Reactive Ion Etching (RIE) may be implemented to realize a mesa structure. The effects of the etch may be improved by Inductively Coupled Plasma (ICP), which adds a coil to a standard RIE chamber for additional plasma enhancement. Principally, this involves the generation of additional ions near the material surface, which creates an ion rich plasma and one that is spatially more uniform than RIE plasmas. Results may include improvements in etching control (e.g., physical and chemical) and enhanced uniformity.

Without special treatments to the mask material, the resulting mesa profile may be approximately 0 to 10 degrees variant from the substrate normal, depending on the photoresist (PR) selected and the conditions under which it is treated prior to etching.

There are at least two methods for creating a mesa with a desired angle. The methods may include reflow of the PR and gray scale masking. PR reflow may be performed by hard baking the photoresist following the exposure, allowing solvents to bake out of the PR and letting the surface become "molten," thereby changing the shape of the PR. For example, a photoresist may be used to achieve a target etch depth of approximately 4 microns is desired. The photoresist may afford a coating of thicknesses greater than approximately 10 microns, thereby allowing the target etch depth to be reached with a SiC/PR selectivity as low as 0.5 microns, for example. An example of this technique and resulting ICP etch is shown in FIG. 5, where 4H SiC has been profiled with a 4 micron mesa.

Figure 5:
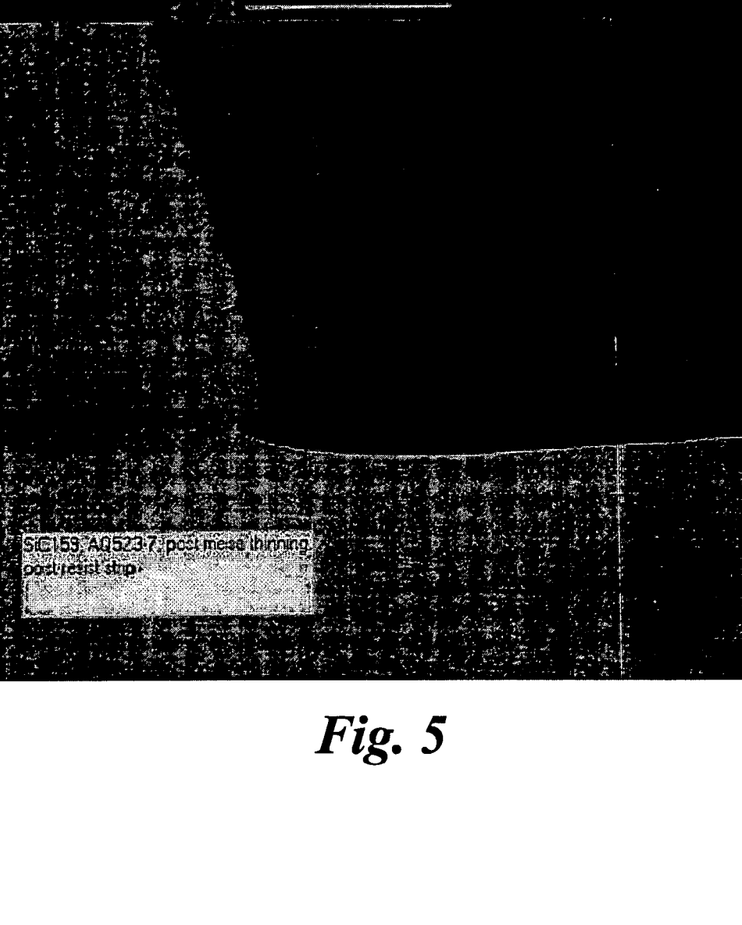
FIG. 5 is an example of a scanning electron micrograph of a sloped mesa profile in accordance with an embodiment of the present invention.

FIG. 5 is an example of a scanning electron micrograph of a sloped mesa profile in accordance with an embodiment of the present invention. In particular, FIG. 5 illustrates a scanning electron micrograph of a corner of a SiC avalanche photodiode. This demonstrates the ability to realize sloped mesa sidewalls using a reflow of photoresist method.

Gray scaling takes advantage of a photoresist mask which has been developed in a way to realize several levels of exposure, as determined by transparency or gray scale. Following the exposure through the mask, the photoresist may be developed away, according to a dose of light received through the mask in each area, which may be determined by the transparency of the mask. Thus, the resist may be profiled without heating the resist to a molten state where a desired PR profile may be controllably realized. This profile may be transferred into a semiconductor material as it is etched. The gray scale mask provides a high degree of etching control and repeatability.

Figure 6:
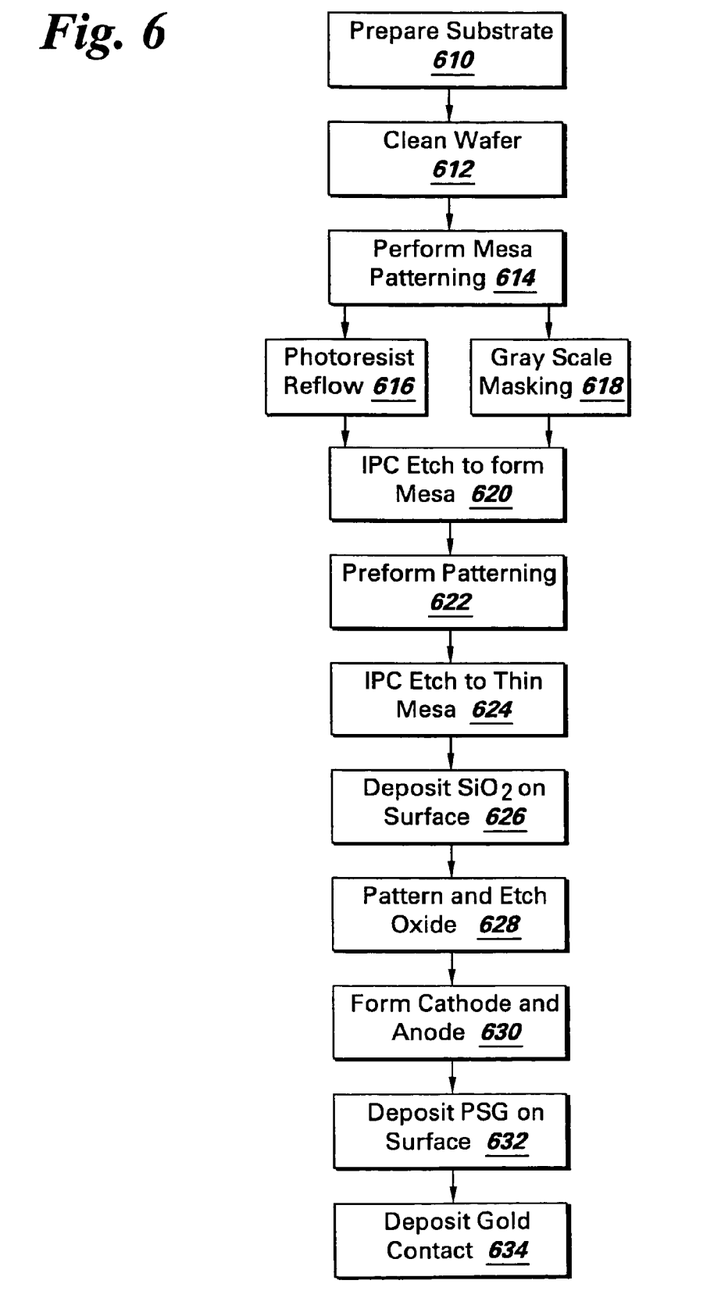
FIG. 6 is a flowchart illustrating a method of fabrication for APDs in accordance with an embodiment of the present invention.

FIG. 6 is a flowchart illustrating a method of fabricating APDs in accordance with an embodiment of the present invention. At step 610, a substrate is prepared which may include preparing a bulk substrate, for example, and a plurality of epitaxial materials. At step 612, a wafer structure may be cleaned where the wafer structure encompasses the substrate and epitaxial materials of step 610. At step 614, mesa patterning may be performed. Mesa patterning may be formed by a photoresist reflow at step 616 or gray scale masking at step 618. At step 620, ICP etching may be performed to form a mesa structure. At step 622, patterning may be performed. In particular, patterning may refer to a photolithography process in which the photoresist is spun onto the wafer at a controlled speed, aligned with a mask, exposed to high energy light, and developed. The resulting photoresist features may include straight sidewalls with photoresist features near vertical. At step 624, ICP etching may be performed to thin the mesa to a desired thickness. At step 626, a layer of $SiO_2$ may be deposited on a surface of the mesa. At step 628, the $SiO_2$ layer may be patterned and etched to a desired shape and/or thickness. At step 630, a cathode and an anode may be formed. The cathode and anode formation may further involve additional steps of patterning, depositing, liftoff, annealing and/or other additional steps. At step 632, a layer of PSG may be deposited on the surface of the mesa. At step 634, at least one contact (e.g., a gold contact) may be deposited on the structure.

Figure 7:
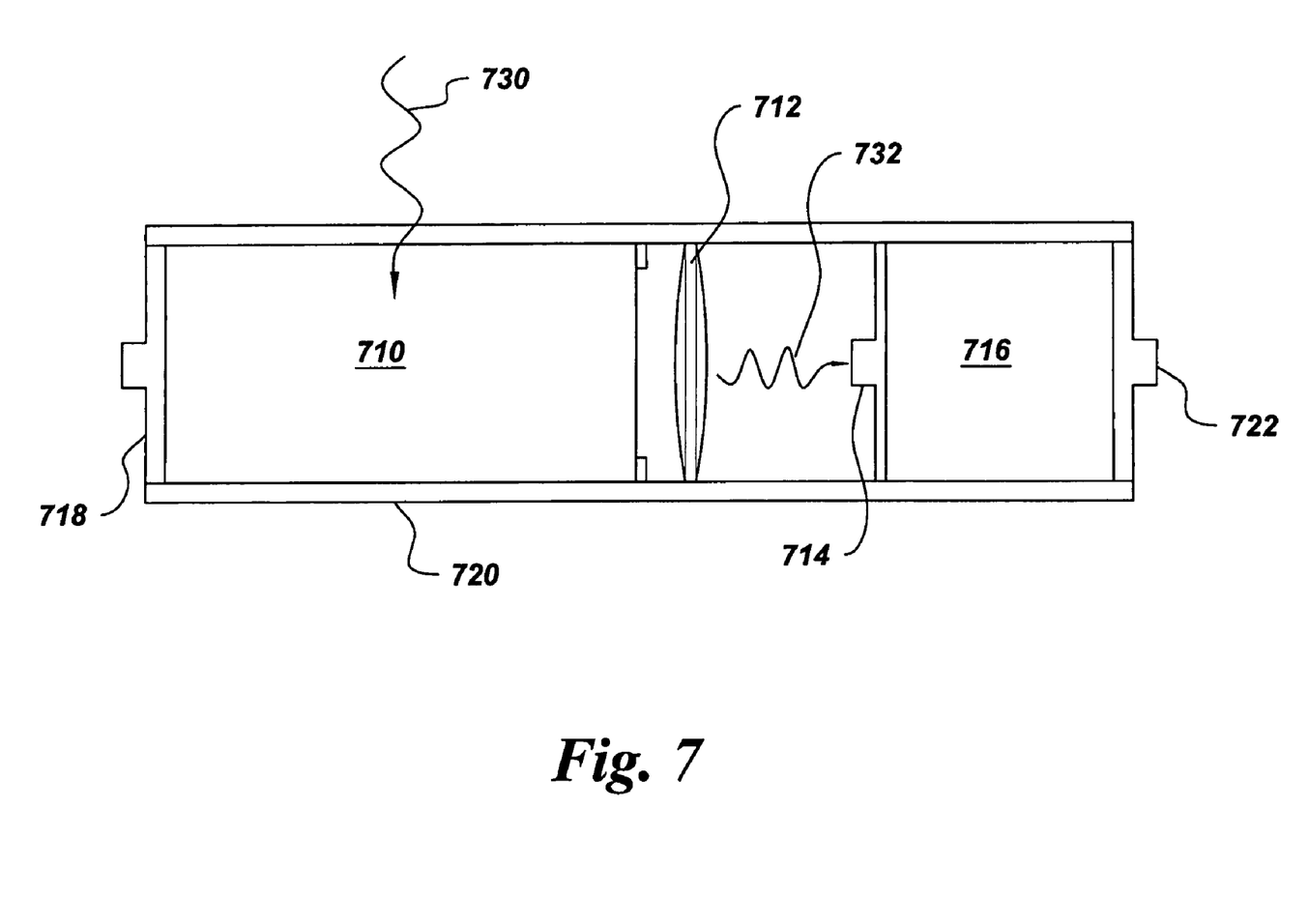
FIG. 7 is an example of a scintillator and a detector in accordance with an embodiment of the present invention.

FIG. 7 is an example of a scintillator and a detector device in accordance with an embodiment of the present invention. The above features of the SiC and GaN APD device may be used with a scintillator which converts gamma ray radiation to UV, observable directly by the SiC and GaN APD. A gamma ray to UV converting scintillator may be implemented for detection of gamma rays down-hole in real time. For example, the SiC and GaN APD of the present invention may detect UV light at approximately 250 to 400 nm.

An APD 732 may be used in conjunction with a scintillator crystal 710 to indirectly detect gamma ray radiation. Scintillator 700 may include a scintillator crystal 710 for receiving gamma rays 730, a lens (or lens structure) 712, APD 714 (e.g., SiC APD or GaN APD) as described in detail above, and amplifier electronics 716. Other elements may be included for additional applications and further embodiments. Scintillator 700 may also include a compression plate 718, shield 720 for providing protection and a cable connector 722. Other external structure may be provided for additional applications and further embodiments.

Scintillator crystal 710 may receive gamma rays 730 and convert gamma ray 730 from H bearing compounds underground, for example, into a UV ray 732. The UV ray 732 may be focused by lens 712 (or other lens structure) and received by an APD 714, such as SiC APD or GaN APD, described in detail above. Additional electronics, such as amplifier electronics 716 may be used to enhance, amplify or otherwise manipulate the received UV signal. These components may be incorporated into a tube for down hole deployment in various applications, such as oil well drilling. The scintillator of FIG. 7 takes advantage of the robust nature of a SiC avalanche photodiode, as shown as 732, operable at high temperatures (e.g., 150° C. to 200° C.) and/or high vibrations (e.g., 250 G).

Figure 8:
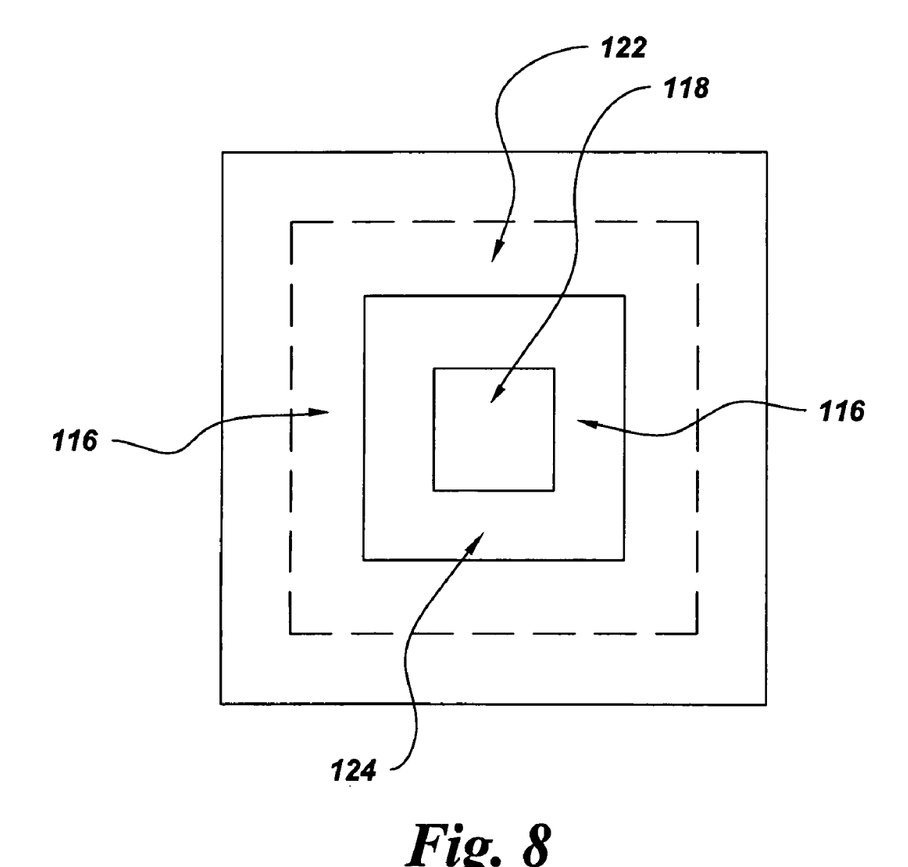
FIG. 8 is a top view of a single APD in accordance with an embodiment of the present invention.
Figure 9:
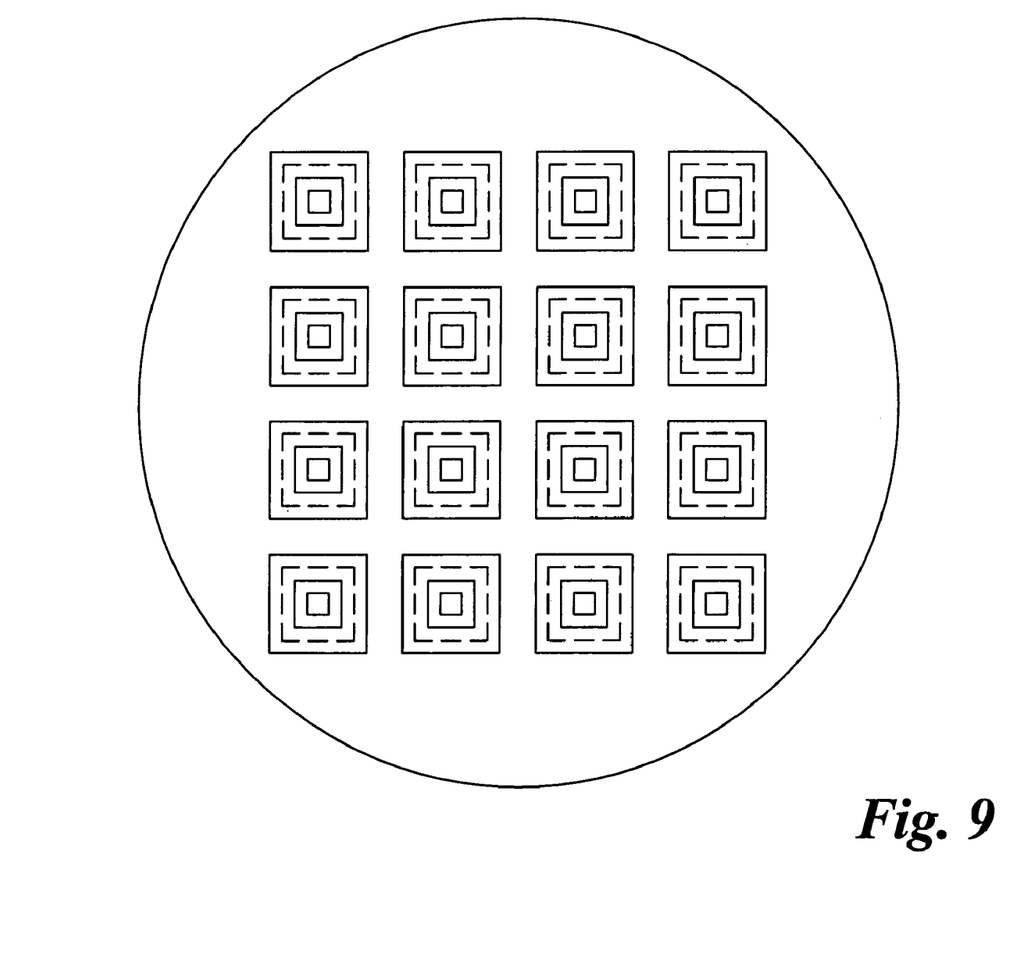
FIG. 9 is an example of an array configuration in accordance with an embodiment of the present invention.

FIG. 8 is a top view of a single APD in accordance with an embodiment of the present invention. The dashed line indicates a bottom of a sloped area. As illustrated in FIG. 8, passivation layers 116 and 122 are shown as covering an outer square surface. Cathode metal 118 is shown as a center square. A top view of PSG layer 124 is shown between cathode metal 118 and passivation layers 116 and 122. FIG. 9 is an example of an array configuration in accordance with an embodiment of the present invention. The above features of the SiC and GaN APD may be integrated in the formation of an array to increase light collection as well as signal output. While a square configuration is shown, other shapes and configurations may be formed by the array of APDs in accordance with an embodiment of the present invention.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

What is claimed is:

1. A detection system for detecting gamma rays, the detection system comprising:
   a scintillator crystal for receiving at least one gamma ray and generating at least one ultraviolet ray;
   an avalanche photodiode for detecting the ultraviolet ray wherein the avalanche photodiode comprises:
      a substrate having a first dopant;
      a first layer having the first dopant, positioned on top of the substrate;
      a second layer having a second dopant, positioned on top of the first layer;
      a third layer having a second dopant, positioned on top of the second layer;
      a passivation layer for providing electrical passivation on a surface of the avalanche photodiode;
      a phosphorous silicate glass layer for limiting mobile ion transport, positioned on top of the third layer; and
      a pair of metal electrodes for providing an ohmic contact wherein a first electrode is positioned below the substrate and a second electrode is positioned above the third layer;
      wherein the avalanche photodiode comprises a first sidewall and a second sidewall forming a sloped mesa shape; and
      wherein the avalanche photodiode operates in an environment comprising a temperature approximately equal to 150 degrees Celsius; and
   a lens structure for focusing the ultraviolet ray from the scintillator crystal to the avalanche photodiode.

2. The detection system of claim 1, wherein the at least one gamma ray indicates presence of an oil reservoir.

3. The detection system of claim 1, wherein the substrate, first layer and the second layer comprise silicon carbide.

4. The detection system of claim 1, wherein the substrate, first layer and the second layer comprise gallium nitride.

5. The detection system of claim 1, wherein the phosphorus silicate glass layer is formed on an exposed portion of the second silicon carbide layer.

6. The detection system of claim 1, wherein the first dopant is p-type and the second dopant is n-type.

7. The detection system of claim 1, wherein the substrate comprises 4H silicon carbide and is doped at approximately $5 \times 10^{18}$ cm$^{-3}$.

8. The detection system of claim 7, wherein the first layer comprises silicon carbide and is doped at approximately $1 \times 10^{17}$ cm$^{-3}$.

9. The detection system of claim 8, wherein the second layer comprises silicon carbide and is doped at approximately $5 \times 10^{16}$ cm$^{-3}$.

10. The detection system of claim 9, wherein the third layer comprises silicon carbide and is doped at approximately $5 \times 10^{18}$ cm$^{-3}$.

11. The detection system of claim 1, wherein an angle forming the sloped mesa shape is between 20 to 60 degrees.

12. The detection system of claim 1, wherein an angle forming the sloped mesa shape is approximately 20 degrees.

13. The detection system of claim 1, wherein the phosphorus silicate glass layer is formed on an exposed portion of the third silicon carbide layer.

14. A detection system for detecting gamma rays, the detection system comprising:
   a scintillator crystal for receiving at least one gamma ray and generating at least one ultraviolet ray;
   an avalanche photodiode for detecting the ultraviolet ray wherein the avalanche photodiode comprises:
      a substrate having a first dopant;

a first layer having a second dopant, positioned on top of the substrate;

a passivation layer for providing electrical passivation on a surface of the avalanche photodiode;

a phosphorous silicate glass layer for limiting mobile ion transport, positioned above of the first layer; and a pair of metal electrodes for providing an ohmic contact wherein a first electrode is positioned below the substrate and a second electrode is positioned above the first layer;

wherein the avalanche photodiode comprises a first sidewall and a second sidewall forming a sloped mesa shape.

15. The detection system of claim 14, further comprising a lens structure for focusing the ultraviolet ray from the scintillator crystal to the avalanche photodiode.

16. The detection system of claim 14, wherein the first dopant is p-type and the second dopant is n-type.

17. The detection system of claim 14, wherein the first dopant is n-type and the second dopant is p-type.

18. The detection system of claim 14, wherein the substrate comprises 4H Silicon carbide and is doped at approximately $5 \times 10^{18}$ cm$^{-3}$.

19. The detection system of claim 18, wherein the first layer comprises silicon carbide and is doped at approximately $1 \times 10^{17}$ cm$^{-3}$.

20. The detection system of claim 14, wherein a second layer is positioned on top of the first layer.

21. The photodiode of claim 20, wherein a third layer is positioned on top of the second layer.

22. The photodiode of claim 21, where the doping of the second layer is of the same polarity as the third layer.

23. The detection system of claim 14, wherein an angle forming the sloped mesa shape is between 20 to 60 degrees.

24. The detection system of claim 14, wherein an angle forming the sloped mesa shape is approximately 20 degrees.

25. The detection system of claim 14, wherein the substrate and the first layer are 4H polytypes.

26. The detection system of claim 14, wherein the substrate and the first layer comprise gallium nitride.

27. The detection system of claim 14, wherein the at least one gamma ray indicates presence of art oil reservoir.

* * * * *